United States Patent
Wang et al.

(10) Patent No.: US 6,784,002 B1
(45) Date of Patent: Aug. 31, 2004

(54) METHOD TO MAKE WAFER LASER MARKS VISABLE AFTER BUMPING PROCESS

(75) Inventors: Hui-Peng Wang, Taipei (TW); Kuo-Wei Lin, Chou Don Jen (TW); Hwei-Mei Yu, Hsin chu (TW); Ta-Yang Lin, Changhua (TW); Charles Tseng, Taichung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/176,940

(22) Filed: Jun. 21, 2002

(51) Int. Cl.⁷ ............................................. H01L 21/66
(52) U.S. Cl. ............................. 438/14; 438/5; 438/22; 438/7; 438/129; 438/40; 438/505; 438/975
(58) Field of Search .............................. 438/14, 5, 22, 438/7, 129, 40, 505, 489, 975, 949, 612, 712

(56) References Cited

U.S. PATENT DOCUMENTS

| | | | |
|---|---|---|---|
| 5,401,691 A | 3/1995 | Caldwell | 437/228 |
| 5,705,320 A * | 1/1998 | Hsu et al. | 430/313 |
| 5,956,596 A | 9/1999 | Jang et al. | 438/401 |
| 6,043,133 A | 3/2000 | Jang et al. | 438/401 |
| 6,121,111 A | 9/2000 | Jang et al. | 438/401 |
| 6,277,658 B1 | 8/2001 | Jeng et al. | 438/14 |

\* cited by examiner

Primary Examiner—Matthew Smith
Assistant Examiner—Igwe U. Anya
(74) Attorney, Agent, or Firm—George O. Saile; Stephen B. Ackerman; Stephen G. Stanton

(57) ABSTRACT

A wafer bumping method comprising the following steps of. A wafer having fields is provided. The wafer having at least one wafer identification character formed thereon within one or more of the fields. A dry film resist is formed over the wafer. Portions of the dry film resist are selectively exposed field by field using a mask whereby the mask is shifted over the one or more fields containing the at least one wafer identification character so that the one or more fields containing the at least one wafer identification character is double exposed after the mask shift so that all of the one or more fields containing the at least one wafer identification character is completely exposed. The selectively exposed dry film resist is developed to remove the non-exposed portions of the dry film resist. Solder is plated over the wafer exposed by the removed portions of the dry film resist to form solder bumps within the fields not containing at least one wafer identification character so that the at least one wafer identification character is readable by optical character recognition.

45 Claims, 3 Drawing Sheets

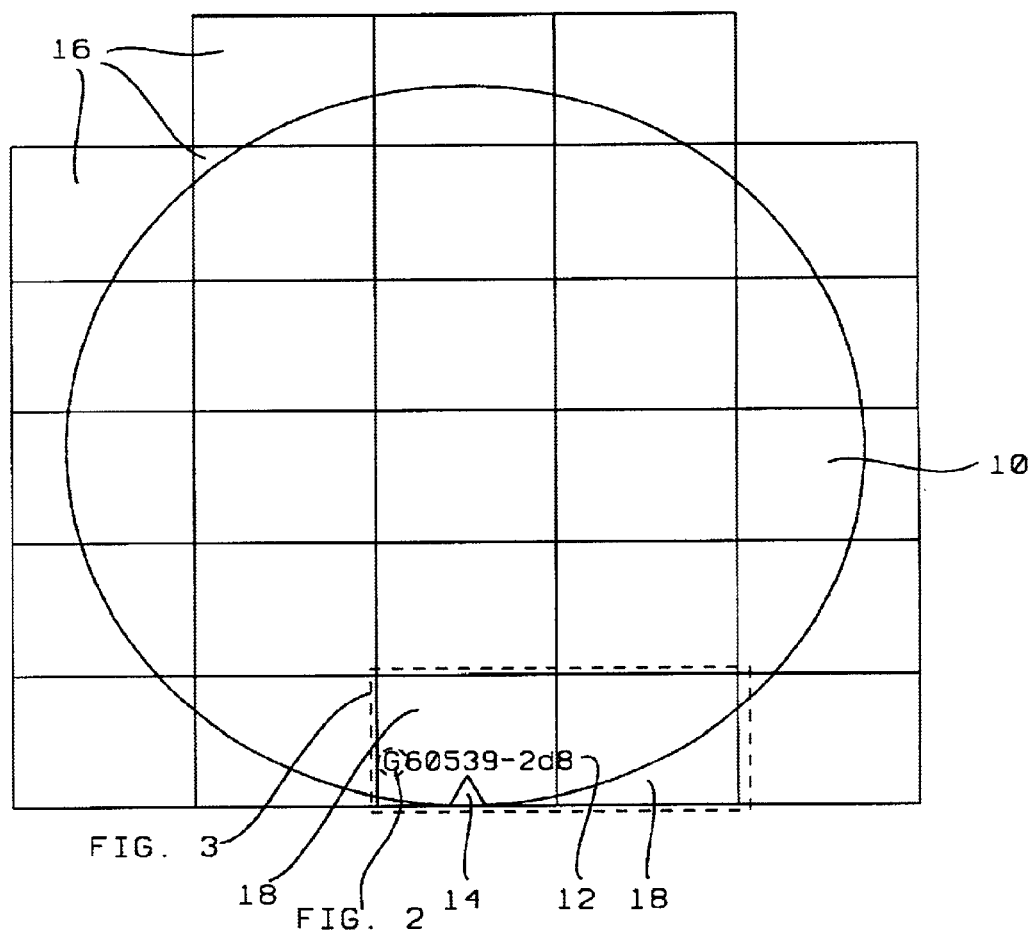
FIG. 1 - Prior Art

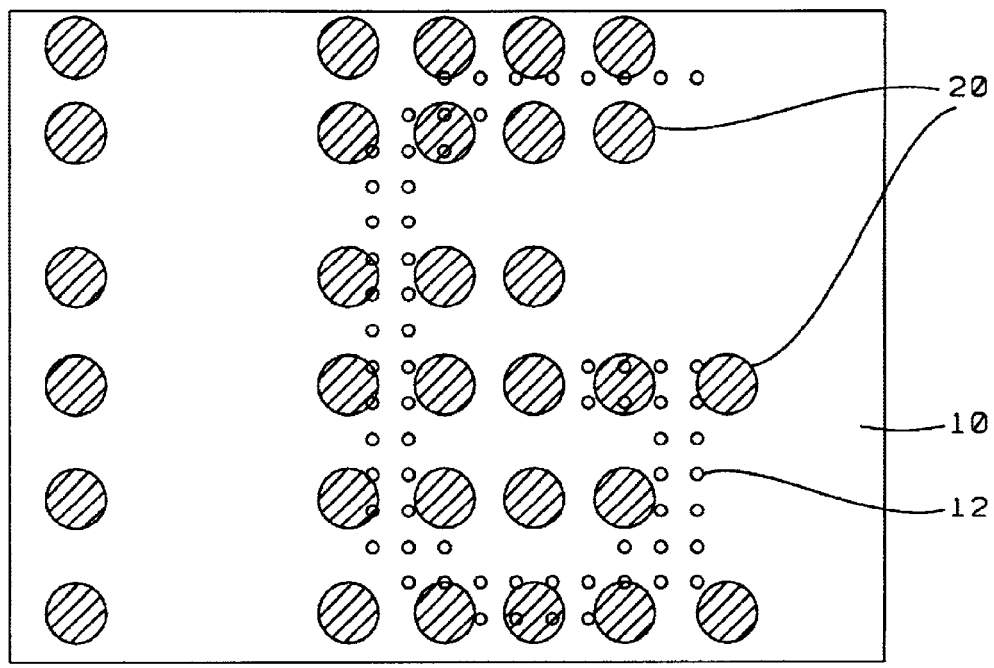
FIG. 2 - Prior Art
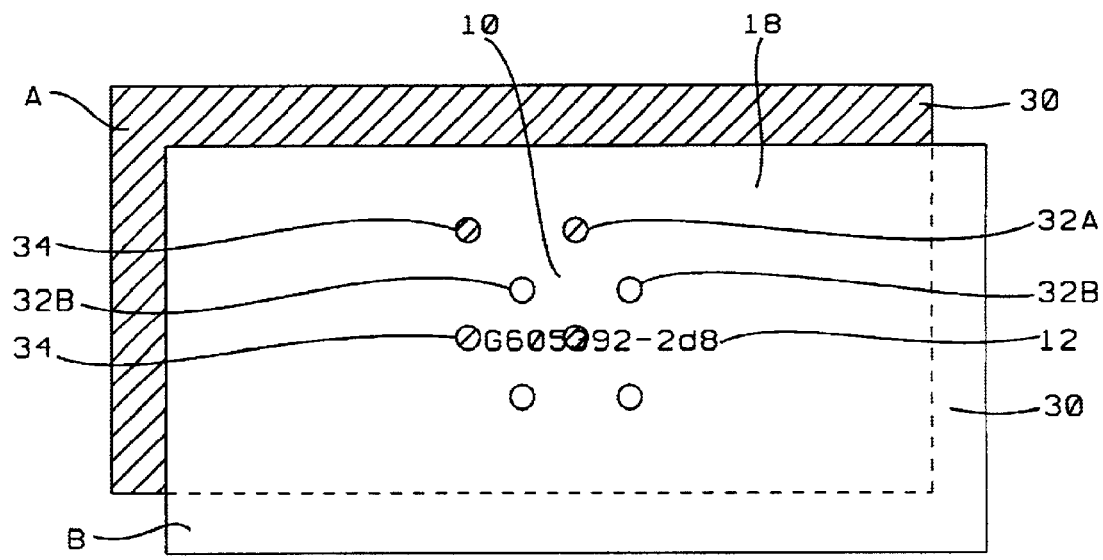
FIG. 3

METHOD TO MAKE WAFER LASER MARKS VISABLE AFTER BUMPING PROCESS

FIELD OF THE INVENTION

The present invention relates generally to semiconductor fabrication and more specifically to maintaining wafer ID characters/laser marks on semiconductor wafers.

BACKGROUND OF THE INVENTION

Semiconductor wafers are identified through the use of laser marks. However, after the wafer bumping process, the laser marks are obscured and are rendered not visible due to overlying bumps obscuring part of or all of one or more identifying letter/numbers. Thus the wafer laser marks can't be subsequently read by optical character recognition (OCR) and causes scrapping of some of the wafers due to wrong wafer ink. That is if the solder bump wafer is defective, the wafer may be incorrectly recognized causing the wafer to be incorrectly inked with an identification number.

For example, as shown in FIG. 1, a wafer 10 may be identified with a wafer ID number with characters 12 such as "G60539-2D8" laser marked on the wafer 10 proximate a notch 14 used to determine the orientation of the wafer 10.

FIG. 2 is an enlarged portion of field 18 of FIG. 1 designated "FIG. 2" after a conventional bump process forming bumps 20. As shown in FIG. 2, the bumps 20 so formed, obscure the wafer ID characters 12 since the bumps 20 are indiscriminately formed over the wafer ID characters 12.

U.S. Pat. No. 6,121,111 to Jang et al. describes a process for removing metal from over the laser mark area.

U.S. Pat. No. 6,043,133 to Jang et al. describes a method of removing a shallow trench isolation (STI) oxide layer from over alignment marks.

U.S. Pat. No. 5,956,596 to Jang et al. describes a process to clean laser marks.

U.S. Pat. No. 5,401,691 to Caldwell describes an open frame for laser marks.

U.S. Pat. No. 6,277,658 B1 to Jeng et al. describes a method that uses a monitor wafer to monitor the shielding of metal over laser marks.

SUMMARY OF THE INVENTION

Accordingly, it is an object of one or more embodiments of the present invention to provide an improved method of making semiconductor wafer laser marks visible after bumping process.

Other objects will appear hereinafter.

It has now been discovered that the above and other objects of the present invention may be accomplished in the following manner. Specifically, a wafer having fields is provided. The wafer having at least one wafer identification character formed thereon within one or more of the fields. A dry film resist is formed over the wafer. Portions of the dry film resist are selectively exposed field by field using a mask whereby the mask is shifted over the one or more fields containing the at least one wafer identification character so that the one or more fields containing the at least one wafer identification character is double exposed after the mask shift so that all of the one or more fields containing the at least one wafer identification character is completely exposed. The selectively exposed dry film resist is developed to remove the non-exposed portions of the dry film resist. Solder is plated over the wafer exposed by the removed portions of the dry film resist to form solder bumps within the fields not containing at least one wafer identification character so that the at least one wafer identification character is readable by optical character recognition.

BRIEF DESCRIPTION OF THE DRAWINGS

The present invention will be more clearly understood from the following description taken in conjunction with the accompanying drawings in which like reference numerals designate similar or corresponding elements, regions and portions and in which:

FIG. 1 schematically illustrates a wafer having a wafer ID.

FIG. 2 is an enlarged portion of FIG. 1 designated as "FIG. 2" showing the results of a conventional bump process.

FIGS. 3 and 4 schematically illustrate a preferred embodiment of the present invention with FIG. 3 representing an enlarged portion of FIG. 1 designated as "FIG. 3" and including fields 18.

DETAILED DESCRIPTION OF THE PREFERRED EMBODIMENT

Figure 4:
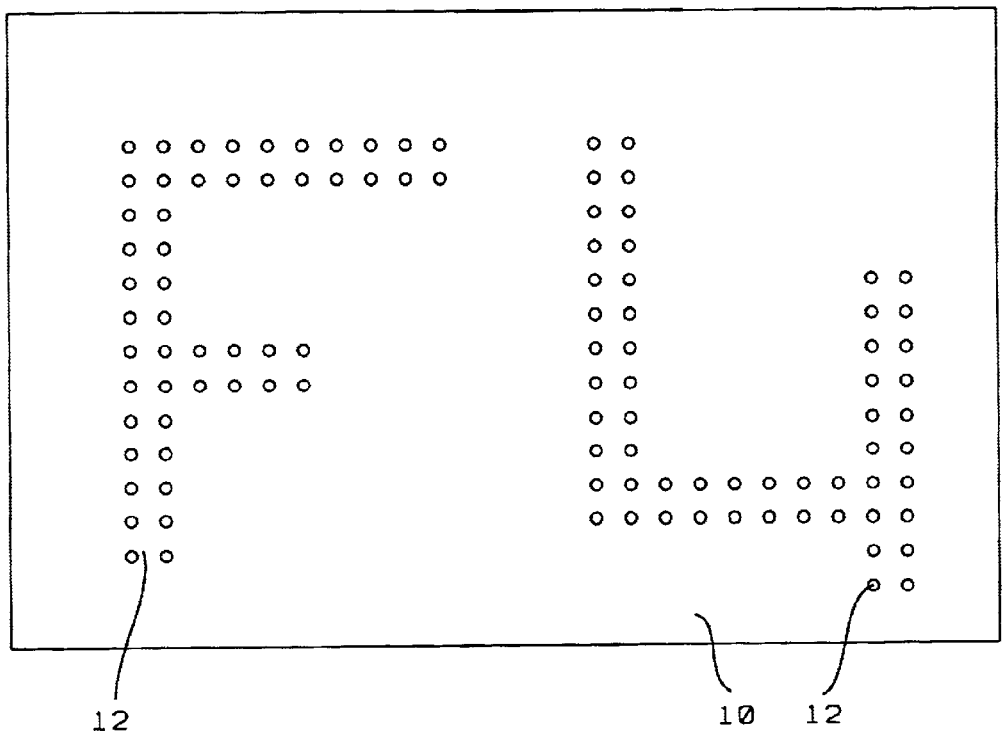

As shown in FIG. 1, wafer 10 has distinct fields 16, 18 which are sequentially exposed, step by step, during the bumping process to form solder bumps. Field(s) 18 of FIG. 1 include the wafer ID characters/laser marks 12. Generally, a plating process is used to form the solder bumps.

A dry film resist (DRF), and preferably a negative-type dry film resist, is employed in the present invention, i.e. unexposed regions of the DFR are soluble and are removed during the development phase. The negative type DFR may be a commercially available thick dry film photoresist The plating bumping process sequence of the present invention is:

DFR laminate→Exposure→Development→Solder Plating→DFR strip

In one key step of the invention and as shown in FIG. 3, the DFR within the field(s) 18 containing the wafer ID characters 12 are double exposed (exposure A and exposure B) with a slight shift in the mask 30 between the exposures A, B by modifying the layout stepper job file.

This ensures that the entire DFR with the field(s) 18 containing the wafer ID characters 12 is/are exposed. Thus the DFR within the field(s) 18 will not be developed during the subsequent development phase and solder bumps will not form within field(s) 18 without any further, deliberate processing.

Mask 30 includes mask portions 32 designated as 32A in the first exposure A and as 32B in the second exposure B. As shown in FIG. 3, during the first exposure A, the portions 34 of the negative-type DFR laminate under mask portions 32A are not exposed. However, the mask 30 is then slightly shifted so that all portions 34 of the negative-type DFR laminate not exposed during the first exposure A are now completely exposed using mask 30 during the second exposure B so that the portions 34 will not be removed during the subsequent development phase.

The DFR laminate is then developed and all unexposed DFR portions are removed, exposing the underlying layer. As noted above, no portions of the DFR within the field(s) 18 containing the wafer ID characters 12 are unexposed, and hence no portions of the DFR within the field(s) 18 containing the wafer ID characters 12 are removed.

A solder plating phase is then conducted to form solder bumps where the DFR was removed during the previous development phase. Thus, no solder bumps are formed within the field(s) 18 containing the wafer ID characters 12 and thus the wafer ID characters 12 are not obscured. The solder plating phase may be a commercially available electric plating.

As shown in FIG. 4, the remaining DFR is then stripped from wafer 10 leaving the wafer ID characters/laser marks 12 visible after the bump process. This permits optical character recognition (OCR) reading of the visible wafer ID characters/laser marks 12. Such OCR may be accomplished by, for example, preferably out going quality check (OQC), backend quality assurance (BQA) or chip probe (CP) testing.

Further processing may then proceed.

Advantages of the Present Invention

The advantages of one or more embodiments of the present invention include:

1. wafer ID field(s) are left readable by OCR after the bumping process;
2. wafer throughput is increased;
3. OCR wafer ID reading accuracy is increased; and
4. miss readings of the wafer ID by the operators may be prevented.

While particular embodiments of the present invention have been illustrated and described, it is not intended to limit the invention, except as defined by the following claims.

We claim:

1. A wafer bumping method, comprising the steps of:
   providing a wafer having fields; the wafer having at least one wafer identification character formed thereon within one or more of the fields;
   forming a dry film resist over the wafer; wherein the dry film resist is a negative-type dry film resist; and
   selectively exposing portions of the dry film resist field by field using a mask whereby the mask is shifted over the one or more fields containing the at least one wafer identification character and the one or more fields containing the at least one wafer identification character is double exposed after the mask shift so that all of the one or more fields containing the at least one wafer identification character is completely exposed.

2. The method of claim 1, further including the step of then developing the selectively exposed dry film resist to remove the non-exposed portions of the dry film resist.

3. The method of claim 1, further including the steps of:
   then developing the selectively exposed dry film resist to remove the non-exposed portions of the dry film resist and plating solder over the wafer exposed by the removed portions of the dry film resist to form solder bumps within the fields not containing at least one wafer identification character so that the at least one wafer identification character is readable by optical character recognition.

4. The method of claim 3, wherein the optical character recognition is selected from the group consisting of OQC, BQA and CP testing.

5. The method of claim 1, including the steps of:
   then developing the selectively exposed dry film resist to remove the non-exposed portions of the dry film resist; and
   plating solder over the wafer exposed by the removed portions of the dry film resist to form solder bumps within the fields not containing at least one wafer identification character so that the at least one wafer identification character is readable by optical character recognition; and
   stripping and removing the remaining dry film resist.

6. The method of claim 1, including a layout stepper job file used to control the exposure of the dry film resist using the mask.

7. The method of claim 1, wherein the mask does not contain a clean-out window.

8. A wafer bumping method, comprising the steps of:
   providing a wafer having fields; the wafer having at least one wafer identification character formed thereon within one or more of the fields;
   forming a dry film resist over the wafer;
   selectively exposing portions of the dry film resist field by field using a mask whereby the mask is shifted over the one or more fields containing the at least one wafer identification character and the one or more fields containing the at least one wafer identification character is double exposed after the mask shift so that all of the one or more fields containing the at least one wafer identification character is completely exposed; and
   developing the selectively exposed dry film resist to remove the non-exposed portions of the dry film resist.

9. The method of claim 8, further including the steps of:
   then plating solder over the wafer exposed by the removed portions of the dry film resist to form solder bumps within the fields not containing at least one wafer identification character so that the at least one wafer identification character is readable by optical character recognition.

10. The method of claim 8, including the steps of:
    plating solder over the wafer exposed by the removed portions of the dry film resist to form solder bumps within the fields not containing at least one wafer identification character so that the at least one wafer identification character is readable by optical character recognition; and
    stripping and removing the remaining dry film resist.

11. The method of claim 8, including a layout stepper job file used to control the exposure of the dry film resist using the mask.

12. The method of claim 8, wherein the dry film resist is a negative-type dry film resist.

13. The method of claim 8, wherein the optical character recognition is selected from the group consisting of OQC, BQA and CP testing.

14. The method of claim 8, wherein the mask include mask portions defining the location of bumps to be formed.

15. The method of claim 8, wherein the mask does not contain a clean-out window.

16. A wafer bumping method, comprising the steps of:
    providing a wafer having fields; the wafer having at least one wafer identification character formed thereon within one or more of the fields;
    forming a dry film resist over the wafer;
    selectively exposing portions of the dry film resist field by field using a mask whereby the mask is shifted over the one or more fields containing the at least one wafer identification character and the one or more fields containing the at least one wafer identification character is double exposed after the mask shift so that all of the one or more fields containing the at least one wafer identification character is completely exposed;

developing the selectively exposed dry film resist to remove the non-exposed portions of the dry film resist; and plating solder over the wafer exposed by the removed portions of the dry film resist to form solder bumps within the fields not containing at least one wafer identification character so that the at least one wafer identification character is readable by optical character recognition.

17. The method of claim 16, including the step of then stripping and removing the remaining dry film resist.

18. The method of claim 16, including a layout stepper job file used to control the exposure of the dry film resist using the mask.

19. The method of claim 16, wherein the dry film resist is a negative-type dry film resist.

20. The method of claim 16, wherein the optical character recognition is selected from the group consisting of OQC, BQA and CP testing.

21. The method of claim 16, wherein the mask include mask portions defining the location of the solder bumps.

22. The method of claim 16, wherein the mask does not contain a clean-out window.

23. A wafer bumping method, comprising the steps of:
providing a wafer having fields; the wafer having at least one wafer identification character formed thereon within one or more of the fields;
forming a negative-type dry film resist over the wafer;
selectively exposing portions of the negative-type dry film resist field by field using a mask whereby the mask is shifted over the one or more fields containing the at least one wafer identification character and the one or more fields containing the at least one wafer identification character is double exposed after the mask shift so that all of the one or more fields containing the at least one wafer identification character is completely exposed;
developing the selectively exposed negative-type dry film resist to remove the non-exposed portions of the negative-type dry film resist; and
plating solder over the wafer exposed by the removed portions of the negative-type dry film resist to form solder bumps within the fields not containing at least one wafer identification character so that the at least one wafer identification character is readable by optical character recognition.

24. The method of claim 23, including the step of then stripping and moving the remaining negative-type dry film resist.

25. The method of claim 23, including a layout stepper job file used to control the exposure of the negative-type dry film resist using the mask.

26. The method of claim 23, wherein the optical character recognition is selected from the group consisting of OQC, BQA and CP testing.

27. The method of claim 23, wherein the mask include mask portions defining the location of the solder bumps.

28. The method of claim 23, wherein the mask does not contain a clean-out window.

29. A wafer bumping method, comprising the steps of:
providing a wafer having fields; the wafer having at least one wafer identification character formed thereon within one or more of the fields;
forming a negative-type dry film resist over the wafer;
selectively exposing portions of the negative-type dry film resist field by field using a mask whereby the mask is shifted over the one or more fields containing the at least one wafer identification character and the one or more fields containing the at least one wafer identification character is double exposed after the mask shift so that all of the one or more fields containing the at least one wafer identification character is completely exposed;
developing the selectively exposed negative-type dry film resist to remove the non-exposed portions of the negative-type dry film resist;
plating solder over the wafer exposed by the removed portions of the negative-type dry film resist to form solder bumps within the fields not containing at least one wafer identification character, and
stripping and removing the remaining negative-type dry film resist, whereby the at least one wafer identification character is readable by optical character recognition.

30. The method of claim 29, including a layout stepper job file used to control the exposure of the negative-type dry film resist using the mask.

31. The method of claim 29, wherein the optical character recognition is selected from the group consisting of OQC, BQA and CP testing.

32. The method of claim 29, wherein the mask include mask portions defining the location of the solder bumps.

33. The method of claim 29, wherein the mask does not contain a clean-out window.

34. A wafer bumping method, comprising the steps of:
providing a wafer having fields; the wafer having at least one wafer identification character formed thereon within one or more of the fields;
forming a negative-type dry film resist over the wafer;
selectively exposing portions of the negative-type dry film resist field by field using a mask whereby the mask is shifted over the one or more fields containing the at least one wafer identification character and the one or more fields containing the at least one wafer identification character is double exposed after the mask shift so that all of the one or more fields containing the at least one wafer identification character is completely exposed; a layout stepper job file being used to control the exposure of the negative-type dry film resist using the mask;
developing the selectively exposed negative-type dry film resist to remove the non-exposed portions of the negative-type dry film resist;
plating solder over the wafer exposed by the removed portions of the negative-type dry film resist to form solder bumps within the fields not containing at least one wafer identification character; and
stripping and removing the remaining negative-type dry film resist, whereby the at least one wafer identification character is readable by optical character recognition.

35. The method of claim 34, wherein the optical character recognition is selected from the group consisting of OQC, BQA and CP testing.

36. The method of claim 34, wherein the mask include mask portions defining the location of the solder bumps.

37. The method of claim 34, wherein the mask does not contain a clean-out window.

38. A wafer bumping method, comprising the steps of:
providing a wafer having fields; the wafer having at least one wafer identification character formed thereon within one or more of the fields;
forming a negative-type dry film resist over the wafer;
selectively exposing portions of the negative-type dry film resist field by field using a mask whereby the mask is shifted over the one or more fields containing the at least one wafer identification character and the one or more fields containing the at least one wafer identification character is double exposed after the mask shift so that all of the one or more fields containing the at least one wafer identification character is completely exposed;

developing the selectively exposed negative-type dry film resist to remove the non-exposed portions of the negative-type dry film resist;

plating solder over the wafer exposed by the removed portions of the negative-type dry film resist to form solder bumps within the fields not containing at least one wafer identification character; and stripping and removing the remaining negative-type dry film resist, whereby the at least one wafer identification character is readable by optical character recognition.

39. The method of claim 38, wherein the optical character recognition is selected from the group consisting of OQC, BQA and CP testing.

40. The method of claim 38, wherein the mask include mask portions defining the location of the solder bumps.

41. The method of claim 38, wherein the mask does not contain a clean-out window.

42. A wafer bumping method, comprising the steps of:

providing a wafer having fields; the wafer having at least one wafer identification character formed thereon within one or more of the fields;

forming a negative-type dry film resist over the wafer;

selectively exposing portions of the negative-type dry film resist field by field using a mask whereby the mask is shifted over the one or more fields containing the at least one wafer identification character and the one or more fields containing the at least one wafer identification character is double exposed after the mask shift so that all of the one or more fields containing the at least one wafer identification character is completely exposed;

developing the selectively exposed negative-type dry film resist to remove the non-exposed portions of the negative-type dry film resist;

plating solder over the wafer exposed by the removed portions of the negative-type dry film resist to form solder bumps within the fields not containing at least one wafer identification character; and stripping and removing the remaining negative-type dry film resist, whereby the at least one wafer identification character is readable by optical character recognition; wherein the optical character recognition is selected from the group consisting of OQC, BQA and CP testing.

43. The method of claim 1, wherein the mask include mask portions defining the location of bumps to be formed.

44. The method of claim 42, wherein the mask include mask portions defining the location of the solder bumps.

45. The method of claim 42, wherein the mask does not contain a clean-out window.

* * * * *